United States Patent [19]
Wong et al.

[11] Patent Number: 5,920,111
[45] Date of Patent: *Jul. 6, 1999

[54] CMOS OP-AMP CIRCUIT USING BJT AS INPUT STAGE

[75] Inventors: Shyh-Chyi Wong, Taichung; Mong-Song Liang, Hsin-chu, both of Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/763,994

[22] Filed: Dec. 12, 1996

Related U.S. Application Data

[62] Division of application No. 08/586,522, Jan. 16, 1996, Pat. No. 5,614,424.

[51] Int. Cl.$^6$ .............................. H01L 29/735; H03F 3/45
[52] U.S. Cl. ........................... 257/558; 257/378; 330/252
[58] Field of Search ................................. 257/378, 556, 257/558; 330/252, 253

[56] References Cited

U.S. PATENT DOCUMENTS

| | | | |
|---|---|---|---|
| 3,541,464 | 11/1970 | Slemmer | 330/252 |
| 3,622,812 | 11/1971 | Crawford | 257/378 |
| 3,684,973 | 8/1972 | Duck | 330/252 |
| 4,089,022 | 5/1978 | Asai et al. | 257/378 |
| 4,486,942 | 12/1984 | Hirao | 29/571 |
| 4,669,177 | 6/1987 | D'Arrigo et al. | 257/378 |
| 4,999,518 | 3/1991 | Dhong et al. | 257/378 |
| 5,268,650 | 12/1993 | Schnabel | 330/300 |
| 5,326,710 | 7/1994 | Joyce et al. | 257/378 |
| 5,489,876 | 2/1996 | Pernici | 330/253 |
| 5,598,128 | 1/1997 | Veit et al. | 330/252 |

*Primary Examiner*—Gene M. Munson
*Attorney, Agent, or Firm*—George O. Saile; Stephen B. Ackerman; Billy J. Knowles

[57] ABSTRACT

An accumulated-base bipolar junction transistor and an application of said transistor is described. A base region of an accumulated-base bipolar junction is formed by the implantation and then the diffusion of a first dopant material into the semiconductor substrate. A base contact region is a rectangular ring of a second dopant type that is implanted and annealed into the base region. The base contact region is to form a low resistance path from the base region to external circuitry. A collector region is formed by the implantation and annealing of third dopant into the base region in the form of a rectangular ring within the base contact region and a first distance from the base contact region. An emitter region is a rectangular form implanted and annealed of the third dopant within the collector region and a second distance from the collector region. An insulating material such as silicon dioxide is deposited upon the surface of said accumulated-base transistor with openings in the insulating material in the base contact region, the collector region, and the emitter region to allow contact with external circuitry. A layer of polycrystalline silicon is deposited over the insulating material in the area between the collector region and the emitter region to form a base accumulator means. The base accumulator means is coupled to the emitter and to external circuitry. When a voltage supply is coupled to the emitter and the base accumulator means, a charge is accumulated at an interface of the base region and the insulating material between the collector region and the emitter region. The charge will improve the conductivity of the base region and the transconductance of the accumulated-base transistor.

1 Claim, 8 Drawing Sheets

CMOS OP-AMP CIRCUIT USING BJT AS INPUT STAGE

This is a division of application No. 586,522, filed Jan. 16, 1996, now issued as U.S. Pat. No. 5,614,424.

BACKGROUND OF THE INVENTION

1. Field Of The Invention

This invention relates to lateral bipolar junction transistors and their application in operational amplifier circuits.

2. Description of Related Art

Bipolar Junction Transistors (BJT) have been critical to the development of the field of electronics and their design are well understood. Lateral BJT's have primarily had applications such as current sources that do not require large $\beta$ (the ratio of the collector current to the base current) or to operate at high frequencies.

In metal oxide semiconductor (MOS) transistor circuits, a parasitic later BJT is present in the area of the drain diffusion, the source diffusion, and the area between the drain and the source of the bulk semiconductor into which the MOS transistor is being fabricated. These parasitic devices often undesirable properties that can detract from the operation of the MOS transistor.

Bipolar Junction Transistors have been critical to the design of operational amplifiers for many years. Since the voltage developed from the base to the emitter ($V_{be}$) of multiple BJT's can be precisely matched in integrated circuits processing, the offset voltage (the voltage developed at the output of the operational amplifier when the input terminals have the same voltage) is very small. However, since there is always a base current ($I_b$) present into the input terminals of the operational amplifier, the input impedance is relatively low.

To improve this impedance, MOS field effect transistors (FET) have replaced the input transistors of operational amplifiers. Since there is very little current flowing into the gate of input MOS FET's, the input impedance of the operational amplifiers employing MOS FET's is very high. The transconductance is not as high as that of a BJT, due to the fact that a BJT has an exponential variation of current versus input voltage whereas a MOS FET has only a quadratic variation of current versus gate biasing. However, the offset voltage is not as low as with the BJT input operational amplifiers, because of variations in the transistor parameters such as threshold voltage ($V_T$), the gain factor (K), and the body factor ($\gamma$). These parameters are effected by the variations in the semiconductor processing. This offset voltage is often compensated for by additional components either with the operational amplifier on an integrated circuit chip or with circuitry external to the integrated circuit chip.

U.S. Pat. No. 5,268,650 (Schnabel) teach a technique for the use of BJT's and FET's in amplifier circuits for high amplification with low offset voltage and low quantities of noise.

U.S. Pat. No. 4,486,942 (Hirao) demonstrates a method for the fabrication of Bi-MOS devices which have bipolar and MOS elements fabricated on the same integrated circuit device.

SUMMARY OF THE INVENTION

An object of this invention is to describe the design of a lateral BJT that has a relatively high $\beta$ over a relatively high frequency spectrum. Another object is to describe the design of a lateral BJT with relatively high $\beta$ while using the identical integrated circuit fabrication techniques as for MOS transistors. Still another object of this invention is to describe the application of a lateral BJT in an operational amplifier circuit to decrease voltage offset.

This invention describes a bipolar junction transistor that is fabricated upon a semiconductor substrate. A base region of first dopant type is implanted and then diffused into the semiconductor substrate, this layer is produced using the same techniques as those used with an n-well in a p-type substrate of a standard CMOS process. A layer of thermal oxide as a gate oxide is grown on the surface of the substrate and openings made with in the oxide for subsequent processing. On top of the thermal oxide, a layer of polycrystalline silicon is deposited in the area between the collector region and the emitter region to form a gate region that is a base accumulation means. A base contact region of a second dopant type is implanted and annealed in the base region to a form a low resistance path from the base region to external circuitry. A collector region and an emitter region of a third dopant type is then implanted and annealed into the base region. The third dopant for the collector and the emitter are self-aligned by the definition of the openings in the gate oxide layer, thus the distance between the collector and the emitter is determined by the gate length which is the length of the gate oxide. The collector region is separated from the base contact region by a first distance and the emitter region is separated from the collector region by a second distance which is the length of the gate oxide. An insulating material is deposited over the semiconductor substrate with openings to allow contact to the base contact region, the collector region, and the emitter region.

By connecting the base accumulating means to the emitter region with a metal layer and coupling the base accumulating means to the external circuitry, that can present a voltage to the emitter region and the base accumulating means, a majority type charge is accumulated in the base region between the collector region and the emitter region. The charge increases the conductivity of the base region, thus reducing the base to voltage developed between the base and the emitter and increasing the input transconductance at a given collector current.

DETAILED DESCRIPTION OF THE INVENTION

Referring to FIGS. 1a–1g, an n-type dopant material is implanted into a p-type substrate 5 and annealed to form the base region 10 of the accumulated-base BJT. A layer of an insulating material 50 such as silicon dioxide is grown on the p-type substrate 5 and the base region 10 to form the gate oxide area. A layer of polycrystalline silicon 60 is deposited on the gate oxide in the are that is to form the gate region that will be the base accumulation means. An n$^+$-type dopant is then implanted into the base region 10 and annealed to form a base contact region 20. A p$^+$-type dopant is next implanted and annealed into the base region 10 into areas separated from the base contact region 20 to form a collector region 30 and a emitter region 40. A side wall spacer 65 is deposited adjacent to the polycrystalline silicon gate region 60. The p$^+$-type dopants that are the collector region 30 and the emitter region 40 are self aligned by the side wall spacer 65 and the polycrystalline silicon gate region 60. The insulating material 50 has openings over the base contact region 20, the collector region 30, the emitter region 40 so as to allow these regions to be connected to external circuitry 70.

Table 1 shows the relative doping levels and the energy levels for the materials that are implanted into the substrate. Table 2 shows the thickness and the temperatures for the deposition of the insulating material that forms the gate oxide and the polycrystalline silicon.

TABLE 1

| Material | Doping Electrons/cm$^3$ | Energy |
|---|---|---|
| n-well | 1e$^{12}$–1e$^{14}$ | 180 K ev |
| p$^+$ | 1e$^{15}$–6e$^{15}$ | 30 K ev |
| n$^+$ | 1e$^{15}$–6e$^{15}$ | 30 k ev |

TABLE 2

| Material | Thickness | Temperature |
|---|---|---|
| Thermal Oxide (insulating material) | 50Å–150Å | 800° C.–950° C. |
| Polycrystalline Silicon | 1500Å–3000Å | 450° C.–650° C. |

Figure 1A:
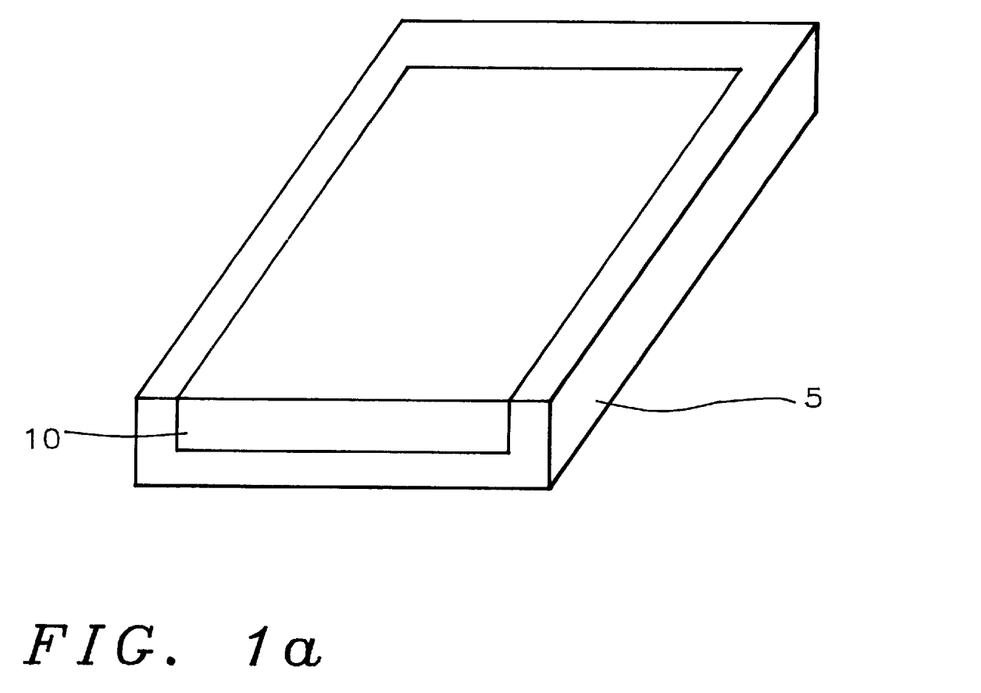
FIGS. 1a–1g is a series of cross sectional views of the steps necessary to fabricate the accumulated-base bipolar junction transistor of this invention.
Figure 1B:
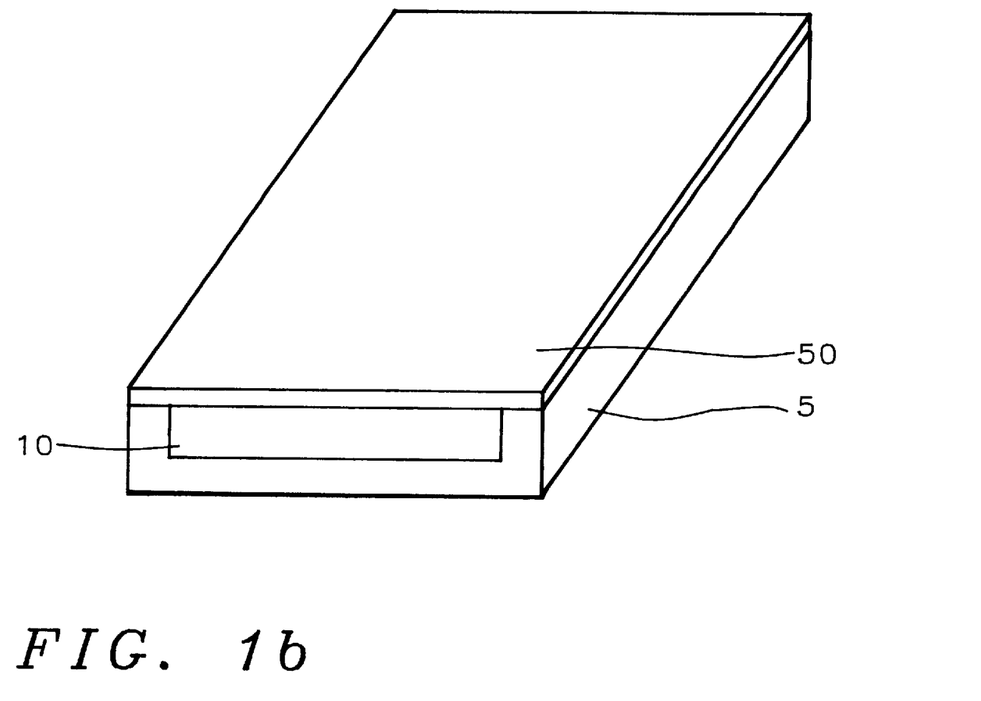
Figure 1C:
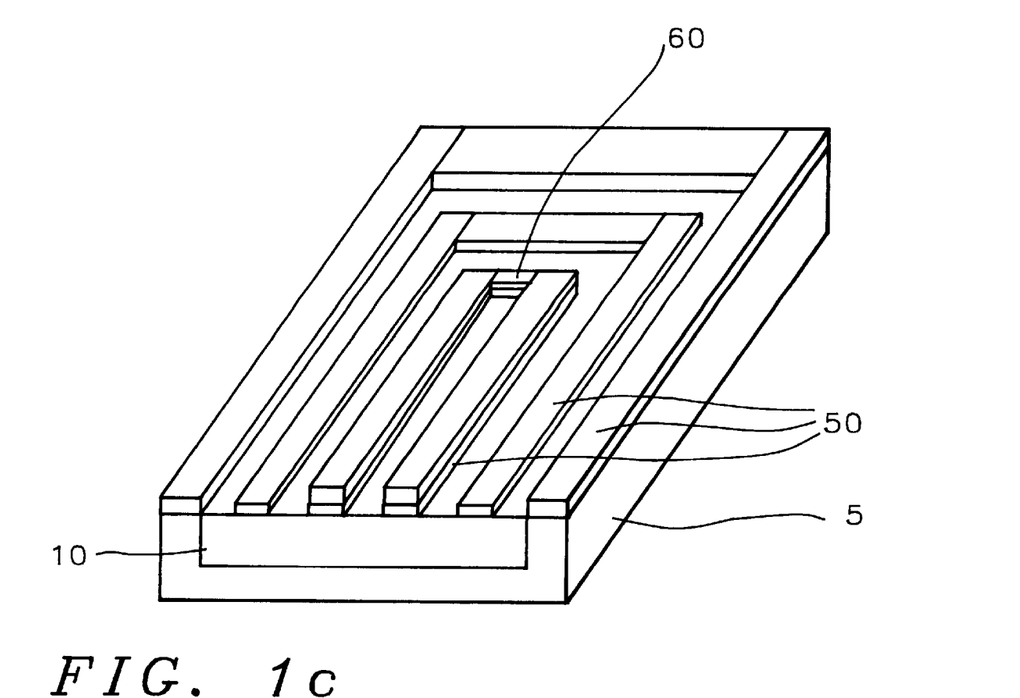
Figure 1D:
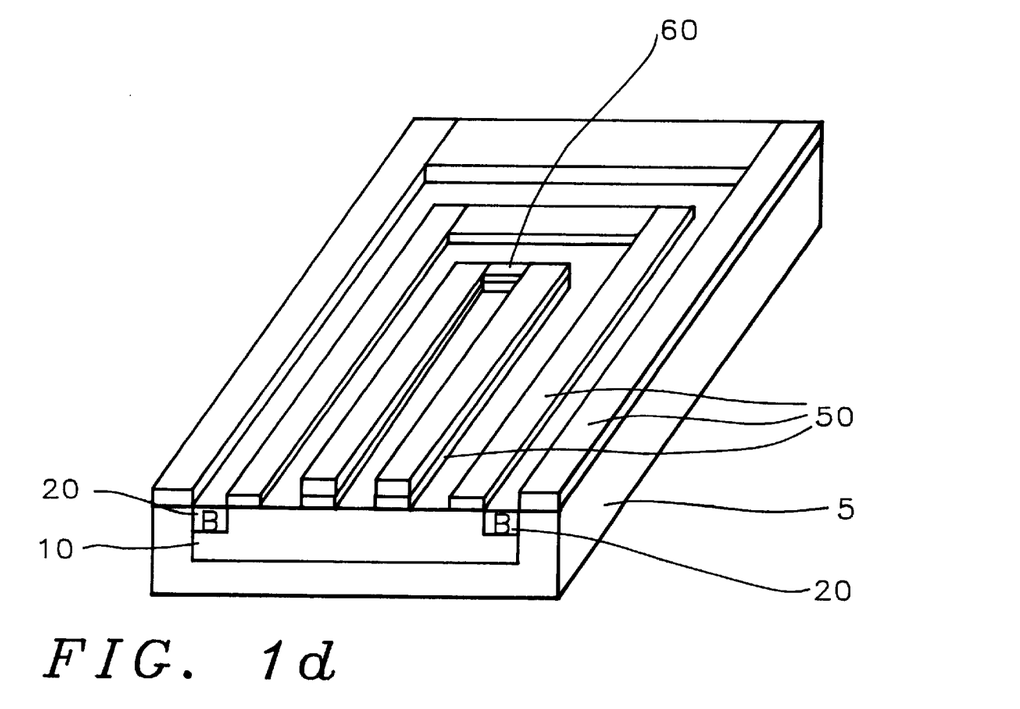
Figure 1E:
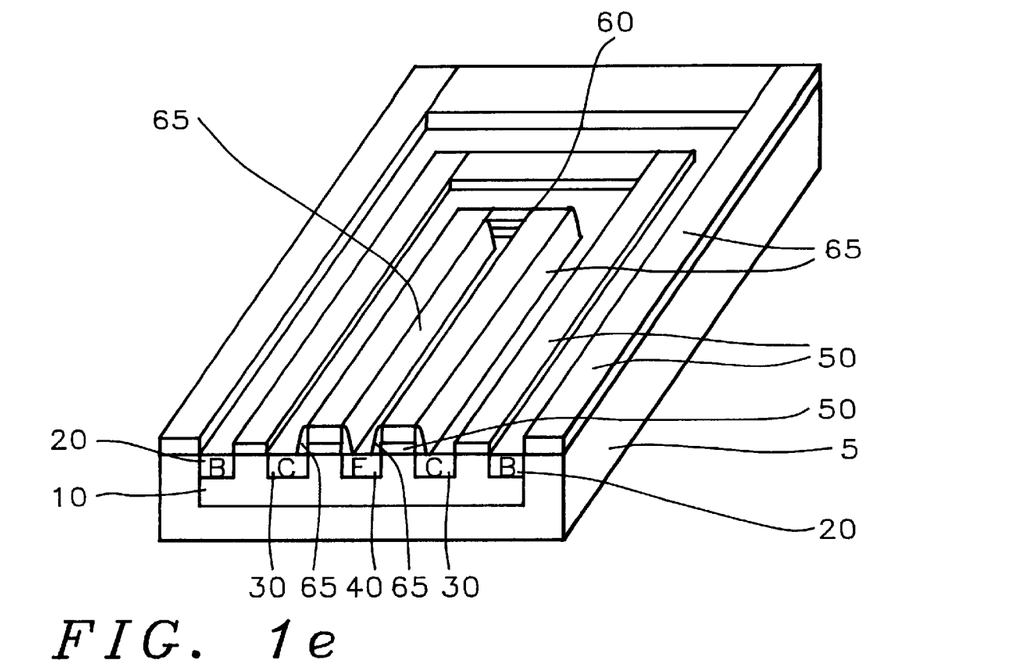
Figure 1F:
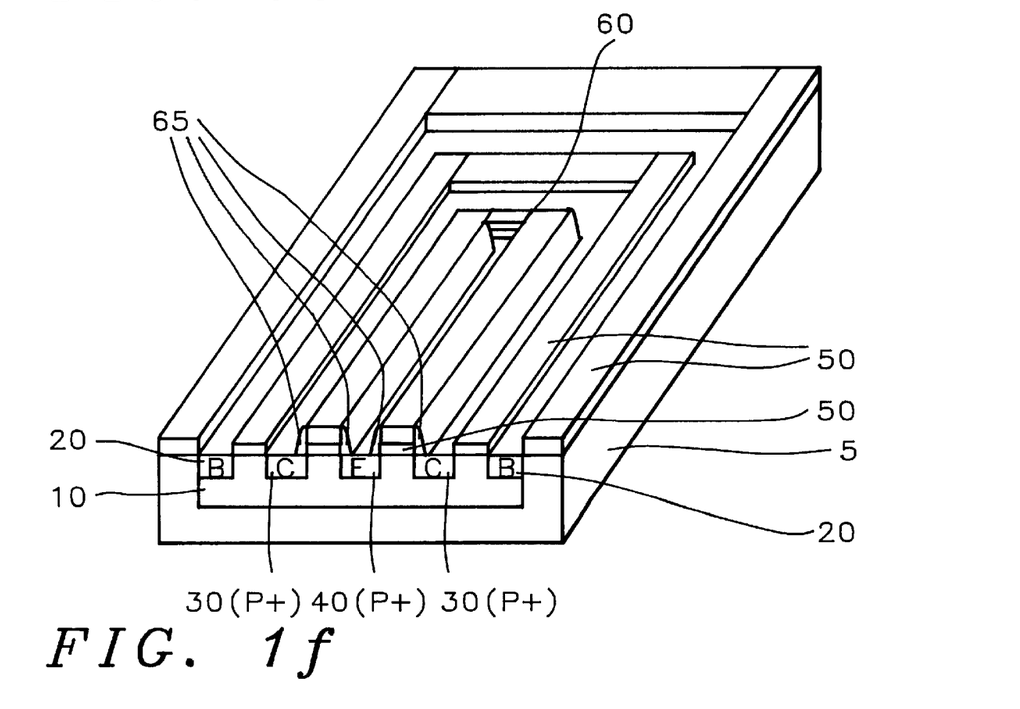
Figure 1G:
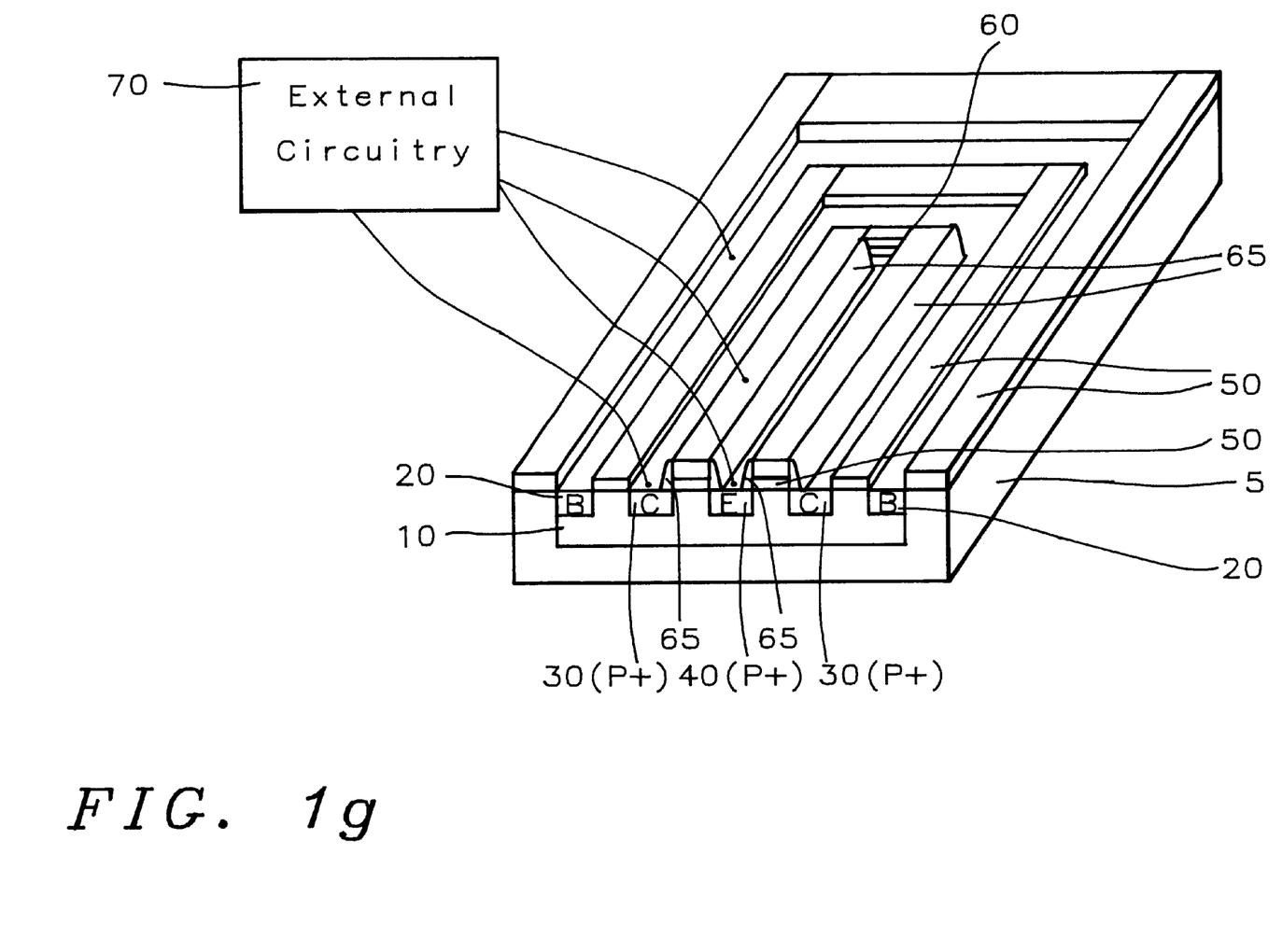
Figure 2:
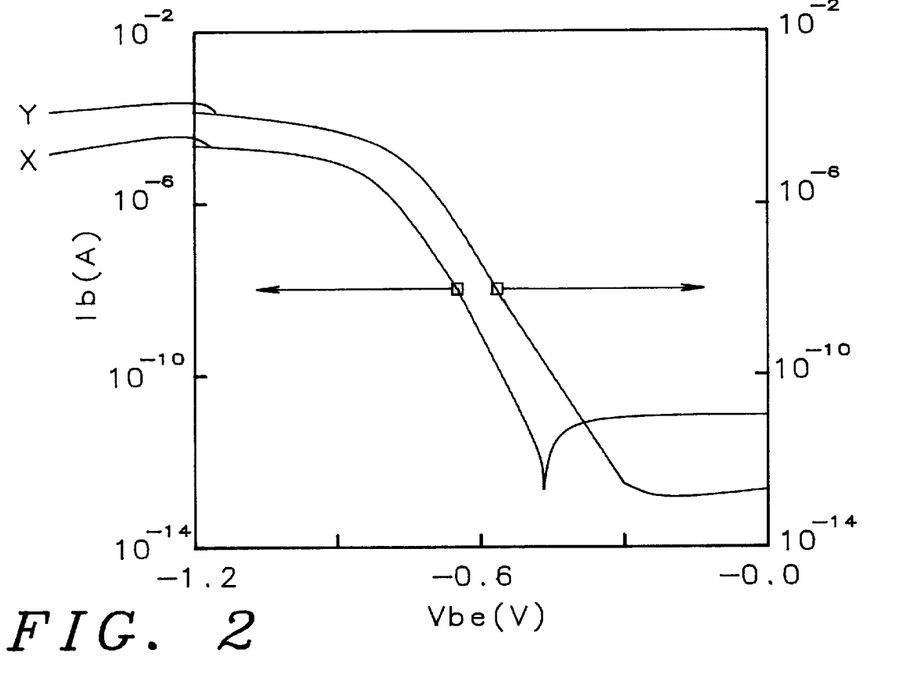
FIG. 2 is a plot of the base current and the collector current versus the voltage developed between the base and the emitter of an accumulated-base bipolar junction transistor of this invention.

The base accumulator means (gate) 60 is connected to the emitter 40 and the external circuitry 70. When the external circuitry 70 provides a first voltage to the base accumulator 60 and the emitter region 40, a second voltage to the base contact region 20, and a third voltage to the collector region 30, an electron-type charge (which is the majority carrier) will accumulate at the interface of the insulating material 50 and the base region 10 between the collector region 30 and the emitter region 40. This charge will increase the conductivity of the base region 10, which will increase the transconductance (the ratio of the current flowing into the collector region 30 ($I_c$) to the voltage developed between the base region 10 and the emitter region 40 ($V_{be}$)). FIG. 2 shows a plot of the current into the base contact region 20 ($i_b$) and $I_c$ versus the $V_{be}$. The change in the $V_{be}$ with respect to a 10 fold (decade) change in the $I_b$ and $I_c$ is approximately 60 mv which is similar to that of conventional vertical BJT's.

Figure 3:
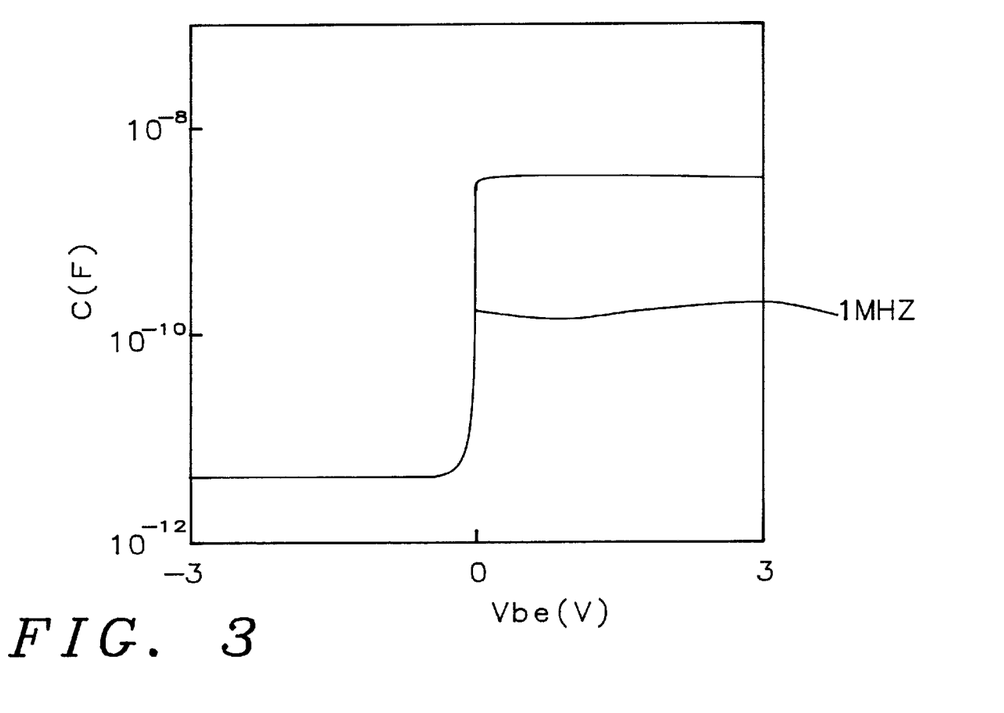
FIG. 3 is a plot of the capacitance of the gate to the base region versus a voltage placed between the gate and the base region of this invention. The voltage of the gate to the emitter is set to zero and the capacitance measured to demonstrate that the base is in the accumulation mode of operation.

FIG. 3 shows a plot of the capacitance-voltage, which is the relative charge that can be accumulated at the interface of the base region 10 and the insulating material 50, in the area between the collector region 30 and the emitter region 40. When the voltage present ($V_g$) between the base accumulator 60 and the base region 10 is positive, or greater than the flat band voltage, then the capacitance as seen between the base accumulator 60 and the base region 10 is increased indicating an increase of the electron-type charge in this region.

Figure 4:
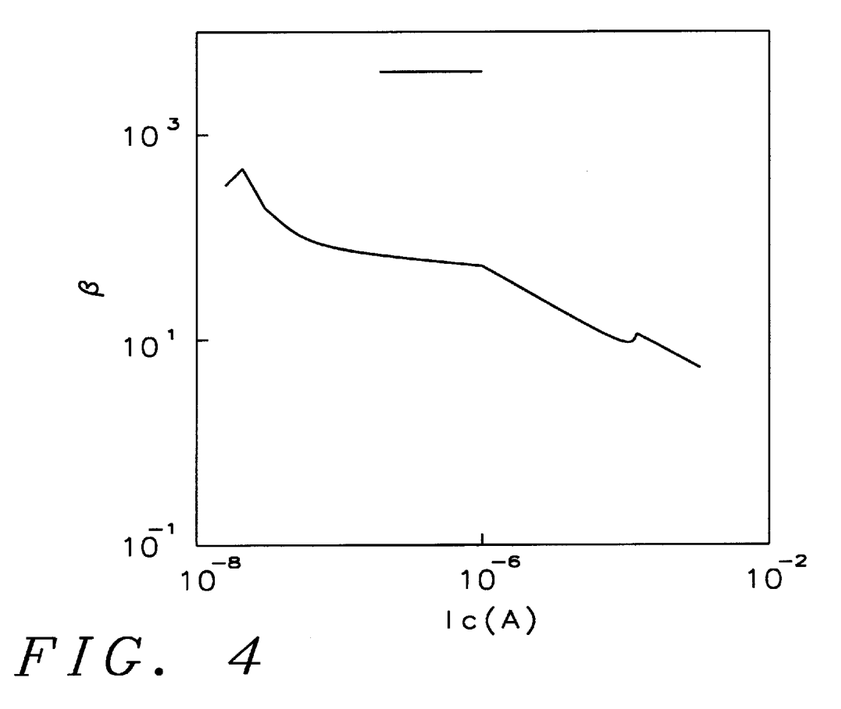
FIG. 4 is a plot of the collector current gain ($\beta$) versus the collector current of an accumulated-base bipolar junction transistor of this invention.

FIG. 4 shows a plot of the β versus the $I_c$ for the accumulated-base BJT. The β remains relatively constant over the three decades of change of $I_c$. The β also is a magnitude that is comparable to those found in conventionally fabricated BJT's.

Figure 5:
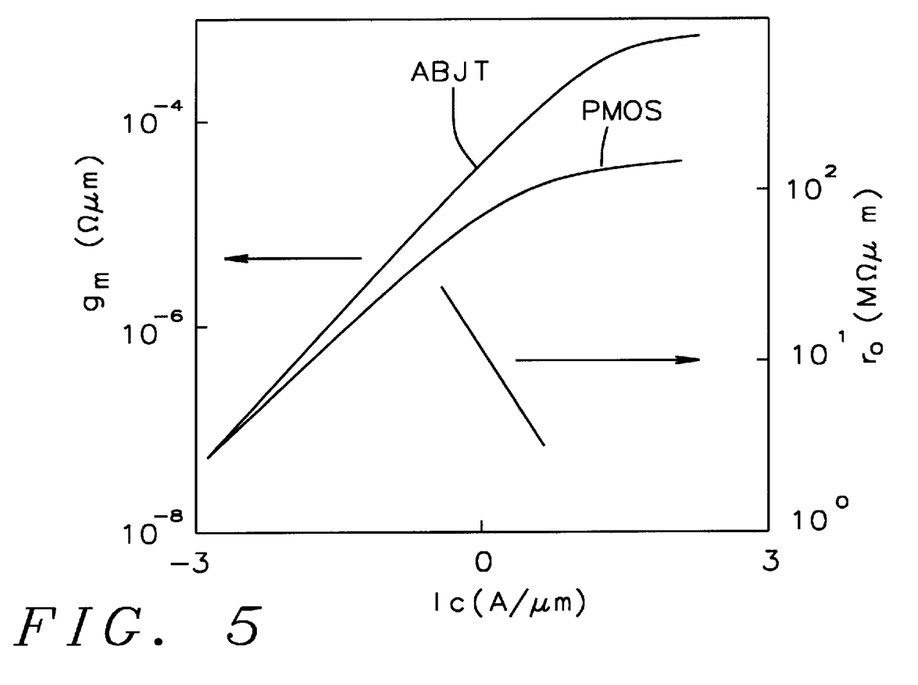
FIG. 5 is a plot of the transconductance ($g_m$) versus the collector current of an accumulated-base bipolar junction transistor of this invention.

An accumulated-base BJT of this invention has a physical design similar to a p-MOS transistor and its application will also be similar. FIG. 5 compares the transconductance ($g_m$)

$$\left(\frac{I_c}{V_{be}}\text{ for an accumulated-base }BJT\right)$$

of an accumulated-base BJT and an equivalent p-MOS transistor. the accumulated-base BJT has its β increasing at a rate that is greater than that of an equivalent pMOS design. The comparison is based on the $g_m$ per unit width versus the collector current ($I_c$) per unit device width, so that factor from the device width is normalized.

Figure 6:
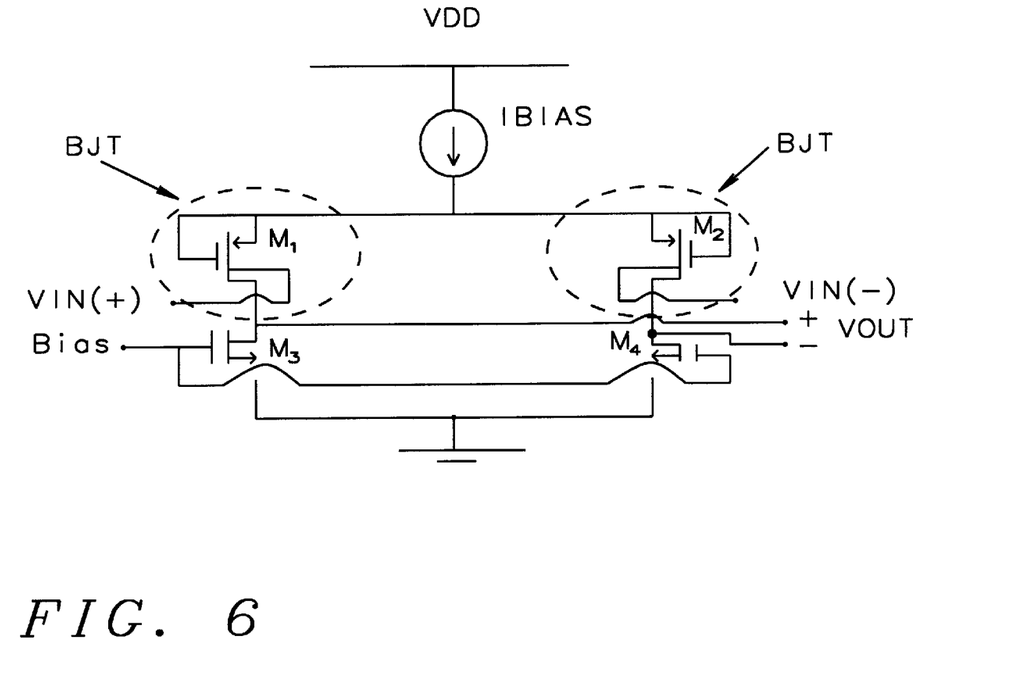
FIG. 6 is a schematic diagram of an application of an accumulated-base bipolar junction transistor of this invention in an operational amplifier circuit.

Referring to FIG. 6, two accumulated-base BJT's M1 and M2 have their emitters and their base accumulators coupled together and connected to a current source $I_{bias}$. The current source $I_{bias}$ is connected to a voltage supply $V_{DD}$. The base of the accumulated-base BJT M1 is connected to the noninverting input $V_{in+}$ and the base of the accumulated-base BJT M2 is connected to the noninverting input $V_{in-}$. The collector of the accumulated-base BJT M1 is connected to the active load formed by the p-MOS transistor M3 and the collector of the accumulated-base BJT M2 is connected to the active load formed by the p-MOS transistor M4. The noninverting output terminal $V_{out+}$ is connected to the collector of the accumulated-base BJT M1 and the inverting output terminal $V_{out-}$ is connected to the collector of the accumulated-base BJT M2.

Figure 7:
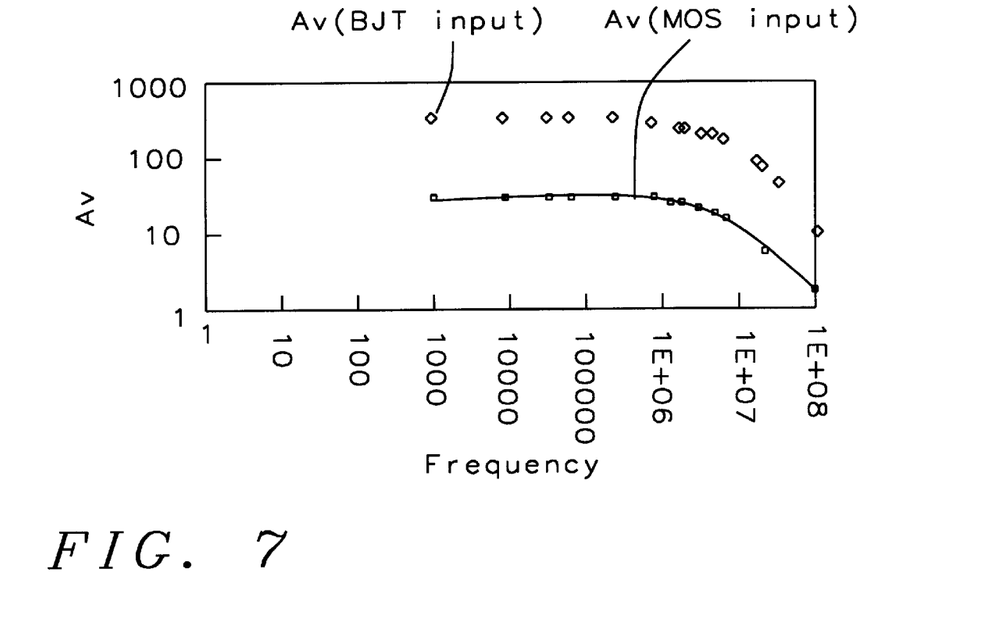
FIG. 7 is a plot of the gain versus frequency of the operational amplifier of FIG. 6.
Figure 8:
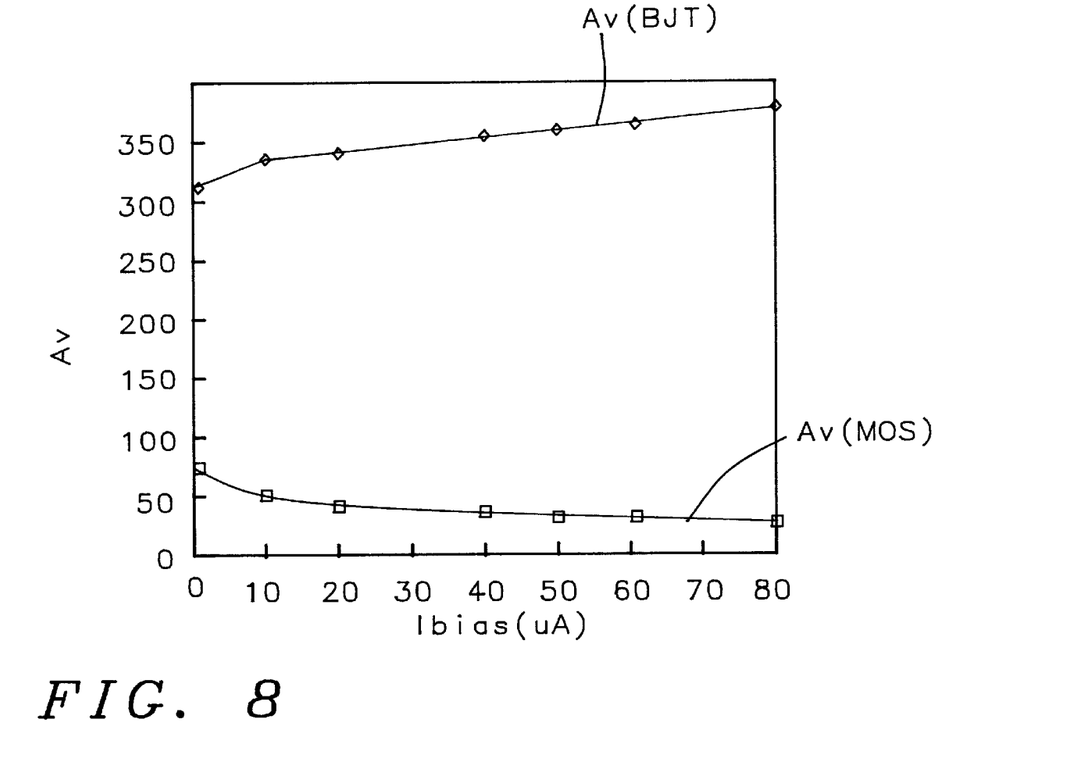
FIG. 8 is a plot of the gain versus the biasing current of the operational amplifier of FIG. 6.

The operational amplifier as shown in FIG. 6 has a gain $A_v$ that is the ratio of the magnitude of the voltage present at the inverting output terminal $V_{out-}$ or the noninverting output terminal $V_{out+}$ and the magnitude of the difference of a voltage presented to the inverting input terminal $V_{in-}$ and a voltage presented to the noninverting input terminal $V_{in+}$. The FIG. 7 is a plot of the gain $A_v$ of the operational amplifier of FIG. 6 and a similar operational amplifier design using p-MOS transistors as the input transistors versus the frequency of the signal presented to the input terminals of the operational amplifier. The gain $A_v$ of the operational amplifier with the accumulated-base BJT has a higher gain $A_v$ than that of the operational amplifier with the p-MOS transistors. FIG. 8 shows the gain $A_v$ of the operational amplifier with the accumulated-base transistors of FIG. 6 and that of a similar operational amplifier using p-MOS transistors versus the magnitude of the current provided by the current source $I_{bias}$. Again the operational amplifier that has the accumulated-base BJT's has a higher gain $A_v$ than that of the similar operational amplifier using the p-MOS transistors.

While the invention has been particularly shown and described with reference to the preferred embodiments thereof, it will be understood by those skilled in the art that various changes in form and details may be made without departing from the spirit and scope of the invention.

What is claimed is:

1. An operational amplifier circuit to create an inverted difference signal and a noninverted difference signal that are each the difference between a first signal and a second signal, coupled between a first and second power supply line comprising:

a) a biasing current source to provide a constant current having a first terminal connected to the first power supply line, and a second terminal;

b) a first accumulated base transistor comprising a base coupled to an inverting input terminal having the first signal, an emitter coupled to the second terminal of the biasing current source, a collector coupled to an inverted output terminal, and a base accumulation means connected to said emitter, such that a voltage presented to the inverting input terminal by the first signal that has a polarity with respect to said emitter so as to develop a charge of majority carriers at an interface of the base between the emitter and the collector thus increasing a parameter of said transistor that is the conductivity, wherein the increase in the conductivity of the base of said first accumulated base transistor will increase the transconductivity of said first accumulated base transistor;

c) a second accumulated base transistor comprising a base coupled to a a noninverting terminal having the second signal, an emitter coupled to the second terminal of the biasing current source, a collector coupled to a noninverted output terminal, and a base accumulation means operably coupled to said emitter, such that a voltage presented to the input terminal by the second signal has a polarity with respect to said emitter so as to develop a charge of majority carriers at an interface of the base between the emitter and the collector thus increasing a parameter of said transistor that is the conductivity, wherein the increase in the conductivity of the base of said second accumulated base transistor will increase the transconductivity of said second accumulated base transistor;

d) a first active load connected between the collector of the first accumulated base transistor and the second power supply line to develop said inverted difference signal; and e) a second active load connected between the collector of the second accumulated base transistor and the second power supply line to develop said noninverted difference signal.

* * * * *